United States Patent
Mei et al.

(10) Patent No.: US 6,599,796 B2
(45) Date of Patent: Jul. 29, 2003

(54) APPARATUS AND FABRICATION PROCESS TO REDUCE CROSSTALK IN PIRM MEMORY ARRAY

(75) Inventors: Ping Mei, Palo Alto, CA (US); Carl P. Taussig, Redwood City, CA (US); Patricia A. Beck, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 09/896,480

(22) Filed: Jun. 29, 2001

(65) Prior Publication Data
US 2003/0003633 A1 Jan. 2, 2003

(51) Int. Cl.$^7$ .......................................... H01L 21/8242
(52) U.S. Cl. ................ 438/243; 438/239; 438/243; 438/244; 438/252; 438/600; 438/601; 438/131; 438/132; 257/104; 257/577; 257/594; 365/105; 365/208; 365/243; 365/165; 365/175
(58) Field of Search ............................ 438/384, 328–36, 438/20, 22, 598–601, 130–132; 257/577, 104, 597; 365/105, 208, 165, 175

(56) References Cited

U.S. PATENT DOCUMENTS

| | | | | |
|---|---|---|---|---|
| 4,419,741 A | * | 12/1983 | Stewart et al. | 365/72 |
| 4,423,432 A | * | 12/1983 | Stewart et al. | 357/45 |
| 4,667,189 A | * | 5/1987 | den Boer et al. | 340/713 |
| 4,698,900 A | | 10/1987 | Esquivel | 437/52 |
| 4,881,114 A | * | 11/1989 | Mohsen et al. | 357/54 |
| 5,008,722 A | | 4/1991 | Esquivel | 357/23.5 |
| 5,170,243 A | * | 12/1992 | Dhong et al. | 365/208 |
| 5,292,678 A | * | 3/1994 | Dhong et al. | 437/50 |
| 5,362,665 A | * | 11/1994 | Lu | 437/52 |
| 5,391,912 A | * | 2/1995 | Horiuchi et al. | 257/588 |
| 5,569,908 A | * | 10/1996 | Bird et al. | 250/208.1 |
| 5,572,015 A | * | 11/1996 | Bird et al. | 250/208.1 |
| 5,650,638 A | * | 7/1997 | Harris et al. | 257/77 |
| 5,736,433 A | * | 4/1998 | Bryant et al. | 438/130 |
| 5,901,065 A | * | 5/1999 | Guruswamy et al. | 364/491 |
| 5,903,041 A | * | 5/1999 | La Fleur et al. | 257/530 |
| 5,991,193 A | * | 11/1999 | Gallagher et al. | 365/171 |
| 6,028,324 A | * | 2/2000 | Su et al. | 257/48 |
| 6,169,686 B1 | * | 1/2001 | Brug et al. | 365/171 |
| 6,180,503 B1 | * | 1/2001 | Tzeng et al. | 438/601 |
| 6,255,671 B1 | * | 7/2001 | Bojarczuk et al. | 257/103 |
| 6,269,018 B1 | * | 7/2001 | Monsma et al. | 365/145 |
| 6,373,090 B1 | * | 4/2002 | Chi | 257/306 |
| 6,385,075 B1 | * | 5/2002 | Taussig et al. | 365/105 |
| 6,396,121 B1 | * | 5/2002 | Bertin et al. | 257/530 |
| 2002/0053857 A1 | * | 5/2002 | Scott et al. | 310/314 |

* cited by examiner

*Primary Examiner*—Matthew Smith
*Assistant Examiner*—Granvill D Lee, Jr.

(57) ABSTRACT

A cross point memory array is fabricated on a substrate with a plurality of memory cells, each memory cell including a diode and an anti-fuse in series. First and second conducting materials are disposed in separate strips on the substrate to form a plurality of first and second orthogonal electrodes with cross points. A plurality of semiconductor layers are disposed between the first and second electrodes to form a plurality of diodes between the cross points of the first and second electrodes. A passivation layer is disposed between the first electrodes and the diodes to form a plurality of anti-fuses adjacent to the diodes at the cross points of first and second electrodes. Portions of the diode layers are removed between the electrode cross points to form the plurality of memory cells with rows of trenches between adjacent memory cells to provide a barrier against crosstalk between adjacent memory cells. The trenches extend substantially to the depth of the n-doped layer in each diode. A process for fabricating the memory array includes formation of the anti-fuse above the diode in each memory cell and extending the passivation material into the trenches as the isolation material. Alternately, the diode may be formed above the anti-fuse, so that the trenches may be substantially more shallow. In addition, a process is provided for fabricating a cross point memory array having a plurality of memory cells on a substrate, each memory cell including a diode adjacent to a line electrode, including etching together in one fabrication step the boundaries extending along a first direction of each of the diodes and each of the line electrodes to form multiple rows of the diodes and the line electrodes extending in the first direction.

17 Claims, 4 Drawing Sheets

APPARATUS AND FABRICATION PROCESS TO REDUCE CROSSTALK IN PIRM MEMORY ARRAY

BACKGROUND OF THE INVENTION

1. Field of Invention

The present invention pertains to the field of memory cell arrays. More particularly, this invention relates to memory structure and fabrication processes for reducing crosstalk between memory cells in a cross point memory array.

2. Background

Portable consumer devices are becoming more compact yet increasingly sophisticated, requiring inherent structure to generate and/or utilize increasing quantities of data. Digital devices, such as digital cameras, may require at least hundreds of megabytes (MB) of data storage either built into or attachable to the camera. To satisfy the needs of this type of data storage application, future storage memories should be relatively low in cost, extremely compact and have capacities of around 100 MB to one gigabyte (GB). The storage memory should also be low in power consumption, less than one watt, and have relatively rugged physical characteristics to cope with the portable battery-powered operating environment.

For archival storage, data need only be written to the memory once. Preferably, the memory should have a short access time, on the order of milliseconds, and a moderate transfer rate, such as one to two MB per second. Preferably, the storage memory should be capable of interfacing with a wide variety of industry standard platforms and modules.

An application for meeting this demand involves the use of write-once cross point memory devices. In cross point memory arrays, a matrix of memory elements are formed, each comprising a fuse or anti-fuse and a diode connected in series. The memory elements are formed by a plurality of semiconductor and passivation layers disposed between conductive lines or electrodes.

One application for utilizing write-once cross point memory arrays to provide high density archival storage in portable devices is described in co-pending U.S. patent application Ser. No. 09/875,356, filed Jun. 5, 2001, entitled "Write-Once Memory", the disclosure of which is incorporated herein by reference. The memory system disclosed therein, referred to as portable inexpensive rugged memory (PIRM), provides high capacity write-once memory at low cost for archival storage. This result is realized in part by avoiding silicon substrates, minimizing process complexity and lowering area density. The memory system includes a memory module formed of a laminated stack of integrated circuit layers constructed on plastic substrates. Each layer contains a cross-point diode memory array. Sensing of the data stored in the array is carried out from a separate integrated circuit remote from the memory module.

Because PIRM memory is relatively inexpensive, users will likely accumulate a large number of PIRM modules with a variety of stored content. It is important to be able to fabricate and assemble memory modules by a straightforward and relatively inexpensive process to minimize the need for precision while maximizing information storage density and simplifying addressing, reading and writing functions.

In layered high-density memory modules, such as described above, the potential for current leakage or "crosstalk" between adjacent memory cells is substantially increased. This problem can result in intolerable increases in error rates and power loss as current leaks between "on" and "off" memory cells, as well as along other potential crosstalk paths.

In FIG. 1, three schematic diagrams illustrate likely paths for leakage current, where the cross point diodes are formed by orthogonal electrode strips having amorphous silicon p-i-n layers between the strips and the anti-fuse is made by interfacing intrinsic amorphorous silicon with a metal with the ability to diffuse into the semiconductor to form a good contact, a "diffusive metal". In FIG. 1A, a grid of cross point memory electrodes 10 is shown. The bottom electrode strips 12–14 in the X direction are orthogonal to the top electrode strips 15–17 in the Y direction. The bottom electrode strips 12 to 14 are made of a conducting material, preferably metal, and the top electrode strips 15–17 are made of diffusive metal, such as silver. Alternate positive voltages, $^+V$, and negative voltages, $^-V$, are imposed on alternate electrode strips in both directions, as shown.

FIG. 1B is a cross-sectional view along the X axis of the central bottom X electrode 13 having a negative voltage, $^-V$ thereon. Top electrode 15 has negative voltage $^-V$ voltage, electrode 16 has a positive voltage, $^+V$ voltage and electrode 17 has a negative voltage, $^-V$. Diodes 20–22 are formed between electrodes 15–17 and electrode 13 by three semiconductor p-i-n layers 23–25 deposited on electrode 13. A $p^+$-doped layer 23 is deposited above an intrinsic i layer 24 which in turn overlays a $n^+$-doped layer 25. Anti-fuses 26–28 are formed by a passivation layer 29 formed above diodes 20–22 and beneath the top electrodes 15–17.

A $p^+$-doped layer is a semiconductor material such as silicon heavily doped with a p-type dopant, such as boron. Similarly an $n^+$-doped layer is a semiconductor material such as silicon that is heavily doped with an n-type dopant, such as phosphorous. The "+" designation indicates that the material has been heavily doped to at least 1% concentration.

Bit-to-bit crosstalk occurs when an anti-fuse of an addressed element is open (without conducting connection) while a neighboring anti-fuse is conducting. One leakage path is from a conducting anti-fuse to the nearest neighbor diode. As shown in FIG. 1B, when anti-fuse 26 is conducting, a leakage current 25 flows from anti-fuse 26 through the p+-layer 23 to neighboring diode 21. The leakage current through the p+-layer is small since the p+-layer is usually very thin, on the order of 20 nanometers.

FIG. 1C is a cross-sectional view along the Y axis of the central top electrode 16 having a positive voltage, $^+V$ thereon. Bottom electrode 12 has a positive voltage, $^+V$, electrode 13 has a negative voltage, $^-V$, and electrode 14 has a positive voltage, $^+V$, imposed thereon. Anti-fuses 31–33 are formed by electrode 16 and passivation layer 29. Diodes 34–36 are formed by p-i-n layers 23–25 and electrodes 12–14. When anti-fuse 31 is conducting, leakage current 37 can flow through p+-layer 23 to neighboring diode element 35. Again, since the p+-layer 23 is quite thin, the leakage current 37 is small. However, the leakage current 38 through the $n^+$layer 24, from electrode 14 of diode 34 to electrode 13 of diode 35, is large and can be a significant factor. The n-type layers are usually thicker and have substantially less resistance than $p^+$layers. In addition, electron mobility is greater than hole mobility, so current leakage is usually greater in $n^+$-layers than in $p^+$-layers.

Leakage current increases with the size of a memory array. FIG. 2 shows a graph giving estimated leakage current (1.E-0X means $10^{-x}$ amps) as a function of memory array size (1.E+0Y means $10^{+y}$ bits of memory). The estimations in the graph assume that the resistivity of phosphorous-doped amorphous silicon is about one kilo-ohm centimeter (K$\Omega$-cm), the thickness of the $n^+$ layer is 100 nanometers, the voltage differences across the electrodes is 5 volts, and the line width equals the line spacing. When the size of a memory array exceeds one megabit ($10^{+6}$ memory cells), the leakage current is greater than 0.1 milliamp ($10^{-4}$ amps), which is unacceptable for a memory array. This point is illustrated in FIG. 2 at point 39. At the present time, consumer units having at least 8 megabytes (64 megabits) of memory are not unusual. Thus, leakage current is a major problem in both existing and future memory arrays.

Others have attempted to construct various means for minimizing current leakage in memory arrays. One such structure is shown in companion patents, U.S. Pat. Nos. 4,698,900 and 5,008,722 (Esquivel), in which a cross point EPROM array has trenches to provide improved isolation and improved leakage current characteristics between adjacent buried $n^+$ bitlines. The Esquivel fabrication process involves etching a trench into a single crystal silicon substrate after surface layers have been removed. The achievement of isolating complex three terminal EPROM transistor devices has unique requirements, not easily translated to other technologies, such as the thin film construction utilized for high-density, portable, inexpensive data storage.

Cross point memory arrays using thin film fabrication and two terminal diode devices present a greater challenge. As used herein, thin film fabrication means using a layer of semiconductor and associated barrier and conductive layers, less than or equal to a few micrometers in thickness, to build memory array devices. These thin film devices involve fabrication of memory cells on very thin substrates such as glass or plastic sheets, where isolation trenches in the substrate are not possible. Under such conditions, new methods and forms of fabrication are needed to minimize the crosstalk problem, which substantially increases with larger and more dense memory arrays.

Accordingly, there is a need for a cross point thin-film memory structure and fabrication process to minimize current leakage or crosstalk between memory cells. Such structure needs to be simple and easily constructed, preferably without additional critical steps or masking in the fabrication process. Isolation structures for thin-film memory cells also need to be realized using simple, low-cost fabrication that is compatible with large-area processing and high density memory construction.

SUMMARY OF THE INVENTION

The present invention provides a cross point memory array structure that implements a trench arrangement between adjacent rows of memory cells to provide isolation and minimize leakage current. A passivation material may be deposited in the trenches to increase the isolation between memory cell rows. The memory cells are preferably fabricated to each have a diode and anti-fuse in series between transverse electrodes. As used herein, "transverse electrodes" means electrodes that intersect at some non-zero angle. The trenches are constructed between memory cell rows, with the trench depth preferably extending to the bottom of the $n^+$-layer. The cells may be fabricated with the anti-fuse above a diode and the passivation material from the anti-fuse may extend into the trenches to provide the isolation material. Alternatively, the diode may be constructed above the anti-fuse so that the $n^+$-layer is higher, to minimize the trench depth. The trenches are cut as part of the usual etching steps for conductors, so that no additional patterning steps are necessary. Moreover, the masking and etching processes are non-critical in nature, as described earlier.

In one embodiment of the preferred invention, a cross point memory array is fabricated on a substrate and has a plurality of memory cells, each memory cell including a diode and an anti-fuse. A first conducting material is disposed in separated discrete areas on the substrate to form a plurality of first electrodes. A second conducting material is disposed in separated discrete areas that are transverse to the discrete areas of the first electrodes and are spaced from the first electrodes to form a plurality of second electrodes having cross points relative to the first electrodes. A plurality of semiconductor layers are disposed between the first and second electrodes to form a plurality of diodes between the cross points of the first and second electrodes. A passivation layer between the first electrodes and the diodes forms a plurality of anti-fuses adjacent to the diodes at the cross points of first and second electrodes. Portions of the diode layers are removed between the electrode cross points to form the plurality of memory cells with rows of trenches between adjacent memory cells to provide a barrier against crosstalk between adjacent memory cells.

In another preferred embodiment, a process for fabricating a cross point memory array has a plurality of memory cells on a substrate, each memory cell including a diode and an anti-fuse. A first conducting material is deposited on the substrate to form a bottom electrode. A plurality of semiconductor layers is successively deposited over the bottom electrode. Portions of the first conducting material and the semiconductor layers are removed to form separate discrete areas of diodes and bottom electrodes extending in a first direction and having trenches extending in the first direction between adjacent diodes to provide a barrier against crosstalk between adjacent cells. A passivation material is deposited above the diodes along each diode discrete area and in the trenches to substantially follow the contour of the trenches. A second conducting material is deposited above the passivation material to form a plurality of top electrodes extending in a second direction transverse to the first direction of extension of the bottom electrodes, thereby providing the plurality of memory cells at the cross points of the top and bottom electrodes.

In another preferred embodiment, a process for fabricating a cross point memory array has a plurality of memory cells on a substrate, each memory cell including a diode and an anti-fuse. A first conducting material is deposited on the substrate to form a bottom electrode. A passivation material is deposited above the first conducting material. Portions of the first conducting material and the passivation material are removed to form strips extending in a first direction along the substrate. A plurality of semiconductor layers is deposited successively over the passivation material. A second conducting material is deposited on the plurality of semiconductor layers. Portions of the second conducting material and the semiconductor layers are removed to form separate strips of memory cells with top electrodes extending in a second direction transverse to the first direction of the bottom electrodes, thereby forming trenches extending in the second direction between adjacent memory cells to provide a barrier against crosstalk between adjacent cells.

In another preferred embodiment, a process is provided for fabricating a cross point memory array having a plurality of memory cells on a substrate, wherein each memory cell includes a diode disposed adjacent to one line electrode. The process comprises etching together in one fabrication step the boundaries extending along a first direction of each of the diodes and each of the line electrodes to form multiple rows of the diodes and the one line electrode extending in the first direction.

Other aspects and advantages of the present invention will become apparent from the following detailed description, which in conjunction with the accompanying drawings illustrates by way of example the principles of the present invention.

BRIEF DESCRIPTION OF THE DRAWINGS

FIGS. 1A–1C are schematic plans and cross-sectional views showing cross point memory devices having diodes and anti-fuses in series;

DETAILED DESCRIPTION OF THE INVENTION

Figure 1A:
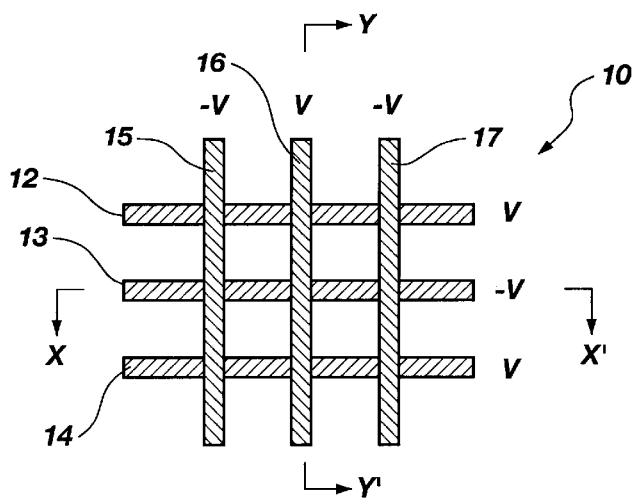
Figure 2:
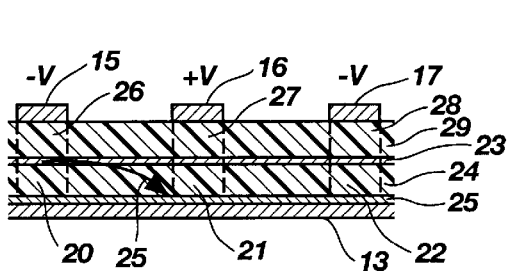
FIG. 2 is a graph illustrating the relationship between leakage current and memory array size for cross-point memory arrays.
Figure 2:
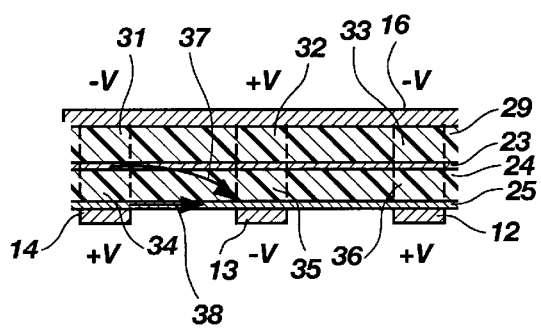
Figure 2:
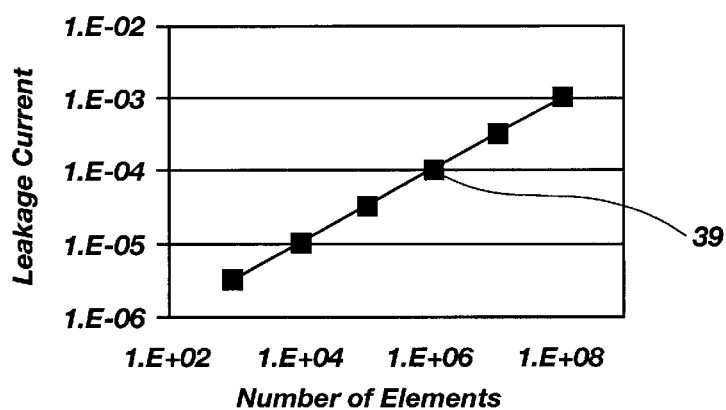
Figure 3A:
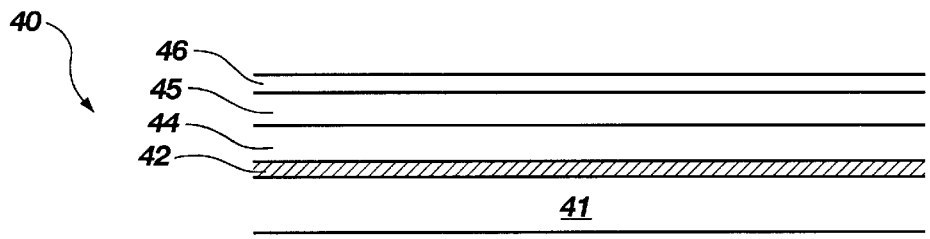
FIGS. 3A–3D are schematic side views showing fabrication steps of a preferred embodiment of a cross point memory array in accordance with the present invention.
Figure 3B:
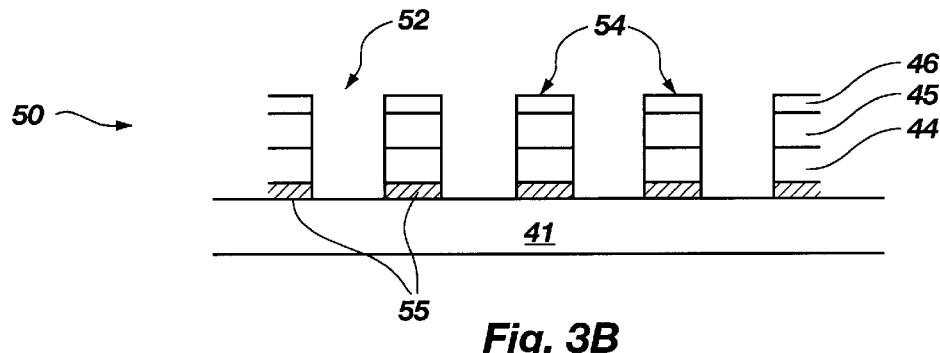
Figure 3C:
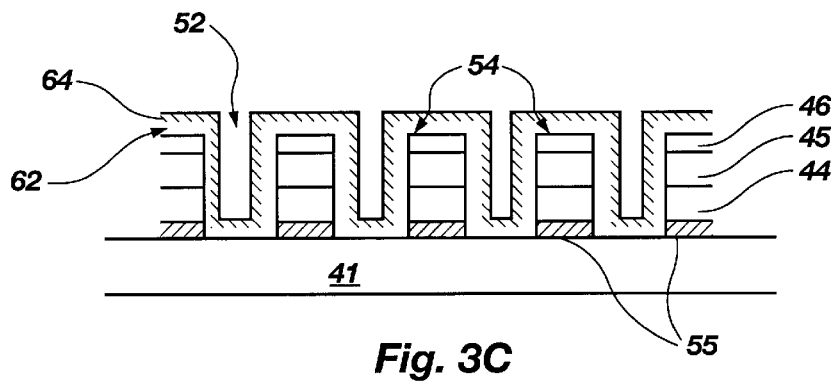

With reference to FIGS. 3A–3C, schematic illustrations of key steps in the fabrication of a cross point memory array according to the present invention are shown. In this embodiment each memory cell comprises a diode and an anti-fuse element in series, with the anti-fuse element on top. As used herein either of the words "fuse" or "anti-fuse" shall refer, interchangeably, to both a fuse that is not conductive when blown and an anti-fuse that is conductive when blown. In most cases, for the preferred embodiments of the present invention, an anti-fuse element is preferred, but either a fuse or an anti-fuse may be used.

FIG. 3A shows a partially-fabricated memory array 40 consisting of three diode p-i-n layers that overlay a bottom electrode layer 42, which in turn is deposited on a substrate 41. As mentioned previously, $n^+$-layer 44 is preferably thicker than $p^+$-layer 46. Intrinsic layer 45 is deposited between the $n^+$-layer and the $p^+$-layer to provide completion of the p-i-n diode. As used herein, the words "intrinsic layer" shall mean a layer with no intentional doping. Typical layer thicknesses are: 20 nanometers for the $p^+$-layer, 100 nanometers for the $n^+$-layer and 200 nanometers for the intrinsic layer.

As shown in FIG. 3B, a memory array 50 is shown in which layers 44–46 and electrode layer 42 have been patterned, preferably by etching, to remove intermediate portions and leave spaced diode rows 54, with trenches 52, between the diode rows mounted on electrode lines 55. Each diode row 54 comprises a pi-n diode, as previously discussed. Etching is performed by defining parallel lines, preferably by optical lithographic processes or by other lithographic processes, including stamping and imprinting. The layers and metal film are then patterned. A dry etching process is preferred. As an alternative, the parallel lines can be formed by a laser ablation technique.

In FIG. 3C a passivation layer 62 has been deposited over each diode row 54 to provide the barrier portion of the anti-fuse as well as over trenches 52 and conforming to the shape thereof. Since current leakage is very likely to occur through the sidewalls, both the sidewalls and the bottom of the trenches are covered with the passivation layer 62. As used herein, "passivation layer" means a layer of material providing a significant reduction in surface current leakage. The passivation layer may be made of intrinsic amorphous silicon, silicon-rich silicon nitride, SiC or other such material.

As shown in FIG. 3C, a conducting layer 64 is deposited over the passivation layer 62 including extending into the trenches 52 in the X direction. The conducting layer 64 may be a "diffusive metal", as previously defined, or any other suitable material. Conducting layer 64 and passivation layer 62 provide an anti-fuse connected in series with each of the diodes 54. Finally, in FIG. 3D the conducting layer 64 is patterned and etched in a direction transverse to the direction of the trenches to define discrete memory cells 66 and conductor lines 68 separated from adjacent memory cells in the Y direction.

The most common arrangement is for the top and bottom electrodes to be orthogonal, that is perpendicular, to each other, but the angle of intersection is not critical except as required for such purposes as packaging. Although the maximum packaging density is achieved by the orthogonal arrangement, the electrodes could be curved and still be transverse as defined herein, provided the electrodes insect at some angle.

Figure 3D:
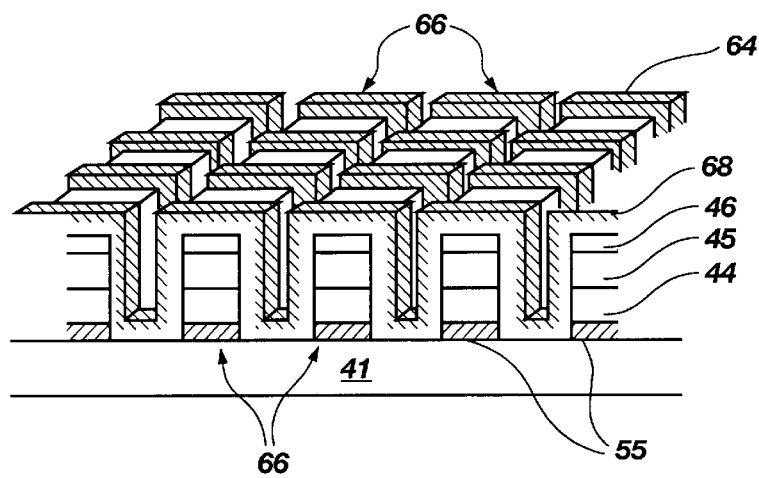

An important advantage of the present fabrication process is the application of only one patterning (masking) and one etching step to fabricate rows of diodes 54 and bottom electrodes 55, as shown in FIG. 3B. Moreover, these masking and etching steps are "non-critical," that is, there is no need to precisely align the etched boundaries with some other element in the array. Other non-critical patterning and etching steps are performed in masking and removing top electrode material between adjacent memory cells in the Y direction, as shown in FIG. 3D. In cross point memory arrays, it is understood that there are at least two sets of patterning and etching steps to fabricate the transverse electrode areas. In the present invention, the fabrication process and resulting isolated memory cells with substantial crosstalk reduction are achieved without any additional patterning steps and without making the existing patterning and etching steps critical.

Another advantage to the embodiment shown in FIGS. 3A–3D is the substantially complete isolation of crosstalk achieved between the diode rows 54. A challenge for this fabrication method is the limitation on an etching process that can produce the smallest features shown.

Figure 4:
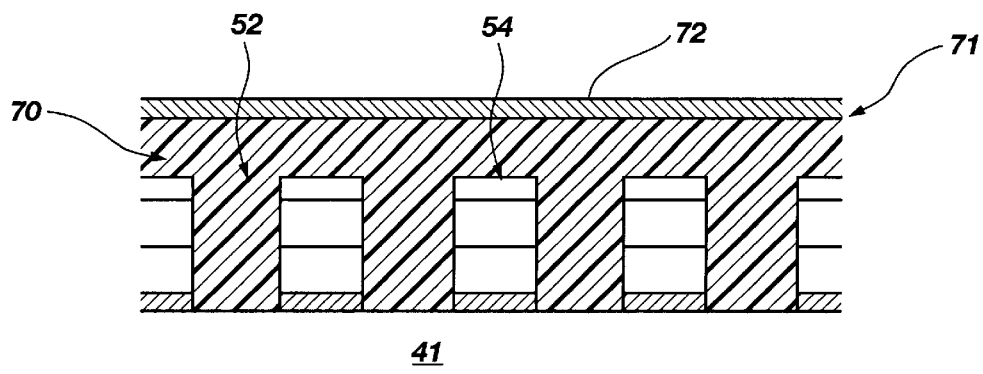
FIG. 4 is a schematic view showing a variation in the embodiment of FIG. 3.

In FIG. 4, a variation is shown to the embodiment of FIG. 3. In this process the same steps are followed as are shown in FIGS. 3A–3B. Thereafter, the passivation material 70 is deposited to cover the trenches 52 and diodes 54 completely to form a substantially planar surface 71 upon which conducting material 72 is deposited. Although this approach requires more passivation material, the fabrication process is substantially simplified by eliminating the need to etch along the contours of the trenches.

Figure 5A:
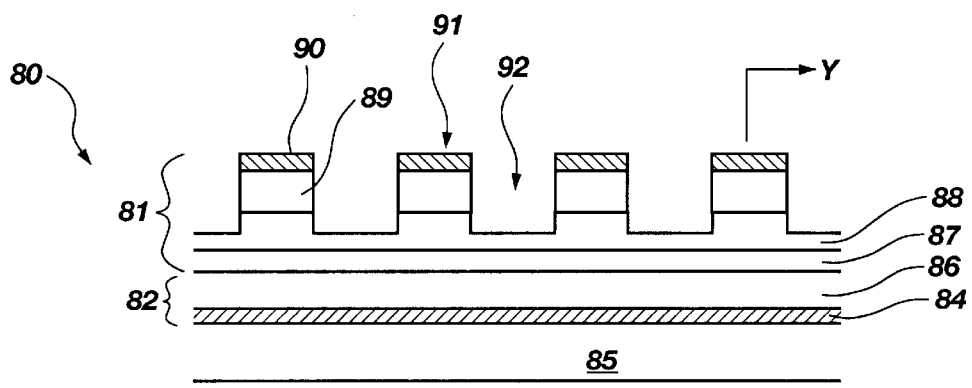
FIGS. 5A, 5B and 6 are schematic side views showing alternative structures and fabrication of additional preferred embodiments of a memory array in accordance with the present invention.
Figure 5B:
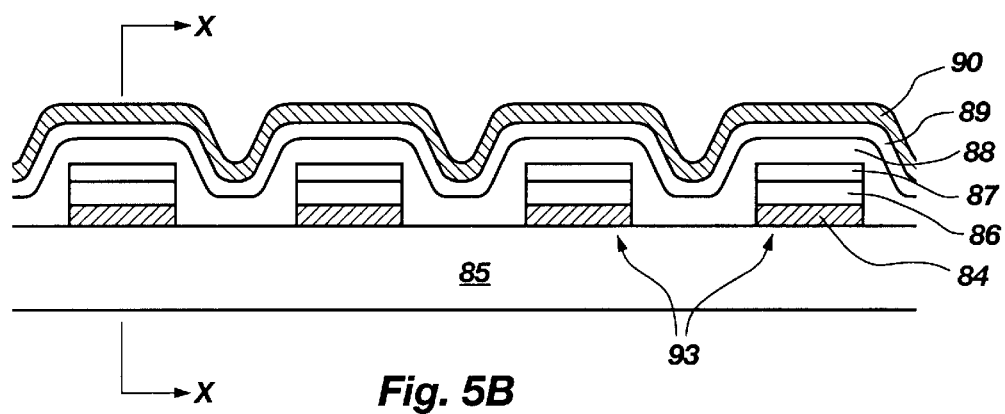
Figure 6:
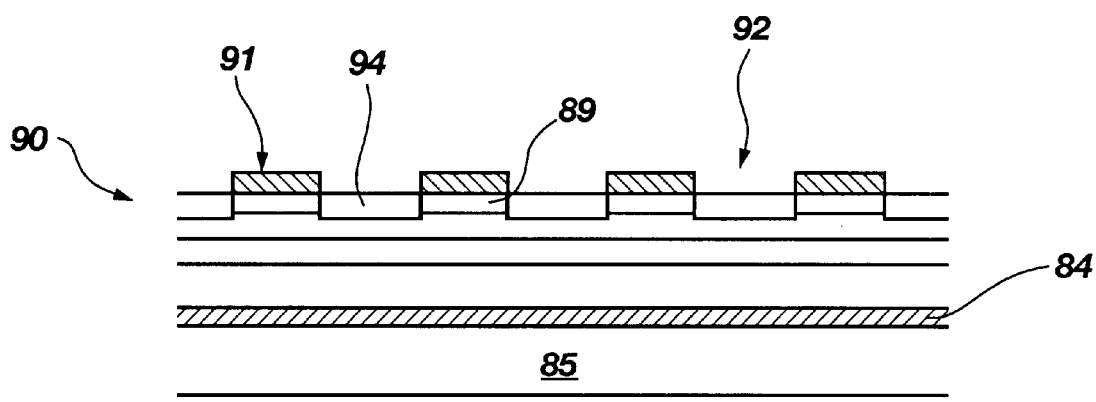

Referring now to FIGS. 5 and 6, another preferred embodiment of the invention is shown in which the memory array 80 has a plurality of memory cells 91, each formed by a diode 81 and an anti-fuse 82 in series with the diode 81 being on top of the anti-fuse 82. The advantage to this approach is that the trenches can be cut substantially shallower. As mentioned, the trenches should have a depth that extends at least as deep as the $n^+$ layer where most of the crosstalk occurs. By placing the diode 81 above the anti-fuse 82, the depth of the trenches can be considerably shallower than in the embodiment shown in FIG. 3 yet still reach a depth that is parallel with the bottom of the $n^+$-layer.

FIGS. 5A and 5B show cross-sectional views along the X and Y axis of a plurality of memory cells 91 having a "diffisive metal" 84 deposited on a substrate 85. Deposited over the "diffusive metal" 1 is a passivation layer 86. Above the passivation layer is a subsequently deposited $p^+$-layer 87. Patterns of separated strips are defined on the surface of the $p^+$-layer 87. The sequence of etching the $p^+$-layer 87, passivation layer 86, and "diffusive metal" 84 results in separated strips 93 of these layer-stacks, as best seen in FIG. 5B. Deposited over the strips 93 is an intrinsic layer 88, an $n^+$-layer 89 and a conductive layer 90. As shown, the $n^+$-layer 89 and the conductive layer 90 have been etched away at intervals to form rows of memory cells 91 and isolation trenches 92. The $n^+$-layer 89 and the conductive layer 90 can be patterned at the same time.

Etching of the conductive material 90 in the X direction is performed as previously shown in FIG. 3D. Subsequently, the $n^+$-layer 89 can be etched by a suitable agent, such as $CF_4$ plasma. The etching process for the $n^+$-layer 89 is not critical because selective etching of the $n^+$ material over intrinsic silicon is not required. Since the thickness of the intrinsic layer 88 is probably more than 200 nanometers, a simple timing of the etch can be utilized to stop the etching in the intrinsic silicon layer 88. Alternately, both the top metal 90 and the $n^+$-layer 89 can be processed by laser ablation or ion milling. The etching depth can be controlled by laser energy density, etch rate or optical interferometry.

In FIG. 6, a memory array 90 shows a variation of the structure and process of FIGS. 5A and 5B. The isolation between memory cells 91 is realized by forming a p-type region 94 between n-type strips 89. Doping can be achieved by a laser technique or ion shower doping process. Both techniques are large-area compatible processes and can be performed with substrates requiring low temperature exposure. Along the Y direction (into the paper), the back-to-back diode configuration prevents lateral leakage. This approach eliminates the trench-etching step, as described with regard to FIGS. 5A and 5B.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. A thin-film cross point memory array fabricated on a substrate and having a plurality of memory cells, each memory cell including a diode and an anti-fuse, comprising:
   a first conducting material disposed in discrete areas on the substrate to form a plurality of first electrodes;
   a second conducting material disposed in discrete areas that are transverse to the discrete areas of the first electrodes and are spaced from the first electrodes to form a plurality of second electrodes having cross points relative to the first electrodes;
   a plurality of semiconductor layers disposed between the first and second electrodes to form a diode between each of the cross points of the first and second electrodes; and
   a passivation layer between the first electrodes and the diodes to form a plurality of anti-fuses adjacent to the diodes at the cross points of the first and second electrodes;
   wherein portions of the diode layers are removed between adjacent electrode cross points to form the plurality of memory cells with rows of trenches between adjacent memory cells to provide a baffler against crosstalk between adjacent memory cells, the passivation layer disposed within the trenches to substantially follow the contour of the trenches to enhance the barrier.

2. A(The cross point memory recited in claim 1, wherein the first electrodes are disposed above and adjacent to the passivation layer and follow the contour of the trenches.

3. The cross point memory array recited in claim 1, wherein the passivation layer substantially covers the trenches.

4. The cross point memory array recited in claim 1, wherein the plurality of semiconductor layers comprise a p-doped layer, an n-doped layer and an intrinsic layer disposed between the p-doped layer and the n-doped layer to form the plurality of diodes.

5. The cross point memory array recited in claim 4 wherein the depth of the trench extends substantially parallel to the bottom of the n-doped layer.

6. The cross point memory array recited in claim 4 and further comprising passivation material disposed in the trenches between the n-doped layers.

7. The cross point memory array recited in claim 6, wherein the passivation material is p-doped material.

8. The cross point memory recited in claim 1, wherein the first electrodes are disposed between the passivation layer and the substrate to form the anti-fuses beneath the diodes.

9. A process for fabricating a thin-film cross point memory array having a plurality of memory cells on a substrate, each memory cell including a diode and an anti-fuse, comprising:
   (a) depositing a first conducting material on the substrate to form a bottom electrode;
   (b) depositing a plurality of semiconductor layers successively over the bottom electrode;
   (c) removing portions of the first conducting material and the semiconductor layers to form discrete areas of diodes and bottom electrodes extending in a first direction and having trenches extending in the first direction between adjacent diodes to provide a barrier against crosstalk between adjacent cells;
   (d) depositing a passivation material above the diodes along each diode area and in the trenches to substantially follow the contour of the trenches; and
   (e) depositing a second conducting material above the passivation material to form a plurality of top electrodes extending in a second direction transverse to the first direction of extension of the bottom electrodes, thereby providing the plurality of memory cells at the cross points of the top and bottom electrodes.

10. The fabrication process recited in claim 9, and further comprising the deposition of the top electrodes above and adjacent to the passivation layer to follow the contour of the trenches.

11. The fabrication process recited in claim 9, and further comprising the deposition of the passivation layer to substantially cover the trenches.

12. The fabrication process recited in claim 9, wherein the step at (b) of depositing the plurality of semiconductor layers comprises depositing a p-doped layer, an n-doped layer and an intrinsic layer that is disposed between the p-doped layer and the n-doped layer to form the plurality of diodes.

13. The fabrication process recited in claim 12 wherein the step at (c) includes forming the depth of the trench to substantially extend even with the bottom of the n-doped layer.

14. A process for fabricating a thin-film cross point memory array having a plurality of memory cells on a substrate, each memory cell including a diode and an anti-fuse, comprising:

(a) depositing a first conducting material on the substrate to form a bottom electrode;

(b) depositing a passivation material above the first conducting material;

(c) removing portions of the first conducting material and the passivation material to form discrete areas extending in a first direction along the substrate;

(d) depositing a plurality of semiconductor layers successively over the passivation material;

(e) depositing a second conducting material on the plurality of semiconductor layers;

(f) removing portions of the second conducting material and the semiconductor layers to form discrete areas of memory cells with top electrodes extending in a second direction transverse to the first direction of the bottom electrodes, thereby forming trenches extending in the second direction between adjacent memory cells to provide a barrier against crosstalk between adjacent cells; and (g) depositing isolating material in the trenches to substantially follow the contour of the trenches between the n-doped layers of adjacent memory cells.

15. The fabrication process recited in claim 14, wherein the step at (b) of depositing the plurality of semiconductor layers comprises depositing a p-doped layer, an n-doped layer and an intrinsic layer that is disposed between the p-doped layer and the n-doped layer to form the plurality of diodes.

16. The fabrication process recited in claim 15, wherein the step at (f) of forming trenches comprises cutting the depth of the trenches to extend substantially even with the bottom of the n-doped layer.

17. The fabrication process recited in claim 14, wherein the step of depositing isolating material comprises the deposition of p-doped material in the trenches between the n-doped layers.

* * * * *